(12) United States Patent
Lenger (10) Patent No.: US 11,749,253 B2
(45) Date of Patent: *Sep. 5, 2023

(54) SYSTEMS AND METHODS FOR INSTRUMENT REVERBERATION DEVICES

(71) Applicant: James Lenger, Chicago, IL (US)

(72) Inventor: James Lenger, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/087,127

(22) Filed: Dec. 22, 2022

(65) Prior Publication Data

US 2023/0129524 A1    Apr. 27, 2023

Related U.S. Application Data

(63) Continuation of application No. 17/121,986, filed on Dec. 15, 2020, now Pat. No. 11,568,852.

(51) Int. Cl.
*G10K 15/08*    (2006.01)
*H04R 17/00*    (2006.01)
*H04R 1/02*    (2006.01)
*H04R 3/00*    (2006.01)
*H03F 3/181*    (2006.01)

(52) U.S. Cl.
CPC ............ *G10K 15/08* (2013.01); *H04R 1/025* (2013.01); *H04R 3/00* (2013.01); *H04R 17/00* (2013.01); *H03F 3/181* (2013.01); *H03F 2200/03* (2013.01); *H04R 2201/028* (2013.01)

(58) Field of Classification Search
CPC .......... G10K 15/08; H04R 1/025; H04R 3/00; H04R 17/00; H04R 2201/028; H03F 3/181; H03F 2200/03
See application file for complete search history.

(56) References Cited

U.S. PATENT DOCUMENTS

2013/0016845 A1    1/2013  Bryan
2018/0315408 A1    11/2018 Cram

FOREIGN PATENT DOCUMENTS

JP        2015-060057        3/2015

*Primary Examiner* — David L Ton
(74) *Attorney, Agent, or Firm* — McDonnell Boehnen Hulbert & Berghoff LLP (57) ABSTRACT

An example reverberation device configured for use with a musical instrument is disclosed. The example reverberation device comprises: (a) an input amplifier configured to receive an input signal from the musical instrument and output an amplified input signal based on the received input signal; (b) an input transducer connected to the input amplifier and configured to transmit the amplified input signal; (c) a reverberation plate comprising a bended surface, wherein the reverberation plate is connected to the input transducer, and wherein the reverberation plate is configured to output the input signal as an output signal at the bended surface; (d) an output transducer connected to the reverberation plate at the bended surface and configured to transmit the output signal; and (e) an output amplifier configured to receive the transmitted output signal from the output transducer and output an amplified output signal.

20 Claims, 5 Drawing Sheets

SYSTEMS AND METHODS FOR INSTRUMENT REVERBERATION DEVICES

CROSS-REFERENCE TO RELATED APPLICATION

This application is a continuation of U.S. patent application Ser. No. 17/121,986, filed on Dec. 15, 2020, which is hereby incorporated by reference in its entirety.

USAGE AND TERMINOLOGY

In this disclosure, unless otherwise specified and/or unless the particular context clearly dictates otherwise, the terms "a" or "an" mean at least one, and the term "the" means the at least one.

SUMMARY

In one aspect, an example reverberation device configured for use with a musical instrument is disclosed. The example reverberation device comprises: (a) an input amplifier configured to receive an input signal from the musical instrument and output an amplified input signal based on the received input signal; (b) an input transducer connected to the input amplifier and configured to transmit the amplified input signal; (c) a reverberation plate comprising a bended surface, wherein the reverberation plate is connected to the input transducer, and wherein the reverberation plate is configured to output the input signal as an output signal at the bended surface; (d) an output transducer connected to the reverberation plate at the bended surface and configured to transmit the output signal; and (e) an output amplifier configured to receive the transmitted output signal from the output transducer and output an amplified output signal.

In another aspect, an example method is disclosed. The method includes: (a) receiving, from a musical instrument, via an input amplifier, an input signal; (b) based on the received input signal, outputting, from the input amplifier to an input transducer, an amplified input signal; (c) transmitting, via the input transducer, the amplified input signal to one or more surfaces of a reverberation plate, wherein the reverberation plate comprises a bended surface; (d) based on the transmitted input signal, outputting, to an output transducer, from the bended surface of the reverberation plate, an output signal; (e) transmitting, via the output transducer, the outputted output signal to an output amplifier; (f) receiving, via the output amplifier, the outputted output signal; and (g) outputting, via the output amplifier, an amplified output signal.

In another aspect, an example reverberation system configured for use with a musical instrument is disclosed. The example reverberation device comprises: (a) an input amplifier configured to receive an input signal from the musical instrument and output an amplified input signal based on the received input signal; (b) a reverberation unit comprising: (i) an input transducer configured to receive an amplified input signal from the input amplifier and configured to transmit the amplified input signal; (ii) a reverberation plate comprising a bended surface, wherein the reverberation plate is connected to the input transducer, and wherein the reverberation plate is configured to output the input signal as an output signal at the bended surface; and (iii) an output transducer connected to the reverberation plate at the bended surface and configured to transmit the output signal; and (c) an output amplifier configured to receive the transmitted output signal from the output transducer and output an amplified output signal.

DETAILED DESCRIPTION

I. Overview

There are a number of effects that can be applied to various musical instruments (e.g., guitars, basses, vocals, etc.) in a number of contexts. One of these effects is reverberation (also know as "reverb"). Reverberation occurs for a number of reasons, one of which occurs when sound waves reflect off of one or more hard surfaces at various distances from a sound source (e.g., a human voice reverberates after singing inside of a large open cathedral).

This effect has been replicated in a number of ways using both digital and analog technologies. One way reverberation has been replicated using analog technology is by transmitting an amplified audio signal into a large, flat, continuous plate of metal (e.g., 6 feet by 9 feet) and detecting that input audio signal as an output audio signal at another point on the same plate. These systems are often referred to as "plate reverbs." These systems, however, present a number of challenges and disadvantages.

For example, due to their size, analog plate reverb systems typically require several people to position, operate, and maintain and are primarily (if not exclusively) used in studio recording settings. Further, these systems often require multiple components to work (e.g., power amplifiers, preamplifiers, speakers, cables, etc.), all or some of which may be positioned around different parts of studio. Thus, portability and consistency of performance, among other things, may be difficult to obtain. Furthermore, because many of these components are in a fixed configuration, there is no way to vary the acoustic and/or mechanical properties of the produced reverberation effect. In spite of these challenges, however, audiophiles, musical artists and enthusiasts, and/or audio recording professionals may still prefer analog plate reverberation systems over digital replications of these systems.

If, however, there was a way to provide analog plate reverberation effects in a smaller, portable, self-contained reverberation device, then audiophiles, musical artists and enthusiasts, and/or audio recording professionals, alike, would benefit.

To address these concerns, one approach may include transmitting an amplified input signal onto one or more surfaces of a dynamically configured reverberation plate and outputting an amplified output signal based on receiving an output signal at one or more other positions/surfaces of the reverberation plate, all in one portable, self-contained device.

Embodiments of the present disclosure provide devices, methods, and systems, for improving the portability, sonic capabilities, and consistency of reverberation devices by receiving a input signal from a musical instrument, amplifying that input signal, transmitting the amplified input signal onto one or more surfaces of the reverberation plate (using a number of different shapes, sizes, materials, and configurations), receiving the reverberated output signal at one or more other surfaces of the reverberation plate, and outputting an amplified, reverberated, output signal based the same. By generating reverberated audio signals using smaller, variably-configured reverberation plates and supporting technologies, audiophiles, musical artists and enthusiasts, and/or audio recording professionals, alike, may be able to unlock new audio capabilities and use analog plate reverb in a number of settings previously unattainable (e.g., live performances, mobile recording setups, etc.).

More specifically, example embodiments disclosed herein relate to devices, methods, and systems that allows users all of the benefits of analog plate reverberation (and more) without the constraints of prior systems.

For example, a reverberation device may be configured for use with any number of musical instruments, including guitar, bass, vocals, drums, keyboards, pianos, horns, wind instruments, stringed instruments, and percussion instruments, among other possibilities. In a further aspect, the reverberation device may be configured for use with other audio signals from any number of other sources (e.g., by an output of a mixing console and/or any device that can transmit an audio signal). In an example embodiment, the reverberation device may have one or more instrument inputs that utilize one or more connection mechanisms (e.g., a ¼ inch cable input, an XLR cable input, a MIDI cable input, etc.), depending on the instrument that is connected to the reverberation device.

In some examples, once connected to the musical instrument, the reverberation device may use one or more amplifiers (e.g., power amplifier, preamplifiers, etc.) or other technologies (e.g., line matching transformers, potentiometers, etc.) to adjust the input signal to a suitable to receive the input signal from the musical instrument and properly output the received input signal as an amplified input signal. In other example embodiments, one or more of these features and controls thereof may be centralized on a specific portion of the reverberation device (e.g., a control panel) to ensure convenient operation for the user.

Once the input signal is amplified, it may be transmitted using one or more transducers configured to transmit the amplified input signal to a reverberation plate. In some examples, the one or more input transducers may be configured to transmit the amplified input signal onto one or more surfaces of the reverberation plate, which may include a particular position on the surface and/or multiple surfaces of the reverberation plate. These configurations may be accomplished in a number of ways.

In some examples, the input transducer may be a piezoelectric transducer. In some examples, the piezoelectric transducer may be connected to a surface and/or fixed in one or more positions on one or more surfaces of the reverberation plate. For example, the input transducer may be mounted on a surface of the reverberation plate using one or more connection mechanisms (e.g., an adhesive, fastener, physical mount, etc.), and connected to one or more components of the reverberation device (e.g., the input amplifier). In some examples, the input transducer may be mounted on a surface of the reverberation plate may be configured to transmit the amplified input signal at a particular position on a surface of the reverberation plate (e.g., on a middle portion of the reverberation plate, on a terminal end of the reverberation plate), depending on the configuration of the reverberation and/or the desired effect, among other possibilities. In a further aspect, the piezoelectric transducer may have one or more materials attached to the surface that makes contact with the reverberation plate, one or more surfaces that do not make contact with the reverberation plate, or both depending on the configuration of the reverberation and/or the desired effect, among other possibilities. For example, the piezoelectric transducer may have wooden materials (or other materials) affixed to the piezoelectric transducer itself to create different reverb effects based on the piezoelectric transducer's contact with the wooden materials and the reverberation plate.

In one example, the input transducer may be a loudspeaker. In a further aspect, the loudspeaker may be a fixed in one or more positions. For example, the fixed position loudspeaker may be mounted on one or more positioning mechanisms (e.g., a small stand and/or boom arm), or integrated into one or more components of the reverberation device (e.g., the cabinet and/or a baffle of the reverberation device). In some examples, the fixed position loudspeaker may be configured to transmit the amplified input signal at a particular position on a surface of the reverberation plate (e.g., on a middle portion of the reverberation plate, on a terminal end of the reverberation plate), depending on the configuration of the reverberation and/or the desired effect, among other possibilities.

In a further aspect, the loudspeaker's position may be variable in relation to the reverberation plate. For example, the variable position loudspeaker may be mounted on one or more positioning mechanisms that can articulate and then lock into a particular position (e.g., a small stand configured to rotate and/or extend and/or an articulating boom arm). In one example, the loudspeaker may be connected to a mount and/or track that allows the loudspeaker to slide in one or more directions in relation to the reverberation plate and then be locked into a particular position at any given time. Furthermore, there may be more than one mount and/or track that allows the loudspeaker to slide in more than one direction (e.g., in both vertical and horizontal directions relative to the reverberation plate). This track, the locking mount/mechanism, loudspeaker, or all three may be integrated into one or more components of the reverberation device (e.g., the cabinet of the reverberation device). In some examples, the variable position loudspeaker may be configured to transmit the amplified input signal at a particular position on a surface of the reverberation plate and then varied in multiple positions relative to the reverberation plate over time, depending on the configuration of the reverberation and/or the desired effect, among other possibilities. Additional examples and/or configurations are possible.

In a further aspect, the loudspeaker's position may continuously and/or intermittently vary in relation to the reverberation plate to produce one or more desired effects. For example, the loudspeaker may be mounted on one or more mechanical devices that cause the loudspeaker to change its position relative to the reverberation plate and/or transmit the amplified signal in a number of ways to produce effects in addition to reverberation. For example, the loudspeaker may be mounted to rotation mechanism that causes the loudspeaker to transmit the amplified input signal in various directions and/or onto multiple different surfaces of the reverberation plate over time. By doing so, the rotating loudspeaker may cause a rotary audio effect and/or audio effects that create more complex reverberations. In other examples, the loudspeaker may vary other parameters of the amplified input signal (e.g., audio volume, one or more audio filters, etc.) while transmitting onto one or more surfaces of the reverberation plate, all of which may cause additional audio effects that create more complex reverberations and/or audio effects. Additional examples and/or configurations are possible.

In a further aspect, the reverberation plate may be made of different materials and/or configured in different ways, depending on the size and purpose of the reverberation device and/or the desired effect. In some examples, the reverberation plate may be made of a metallic material, including, for example, aluminum, steel, copper, and/or other metallic materials, including alloys and other treated metallic materials. In other examples, the reverberation plate may be made of other types of materials, including wooden materials such as spruce, mahogany, maple, rosewood, walnut, pine, and/or laminates and other combinations of wooden materials. In still other examples, the reverberation plate may be made of additional materials, depending on the configuration of the reverberation and/or the desired effect, among other possibilities.

In addition to being made of various materials and/or combinations thereof, the reverberation plate may be configured and/or shaped in various ways. As discussed above, plate reverbs are typically made up of very large, continuous, flat sheets of metal. However, in some example embodiments of this disclosure, the reverberation plates may not only be smaller, but they may also be bent, folded, and/or shaped in various ways to reduce the space required to contain and use these reverberation plates, and also to create new sonic and/or audio signal possibilities.

For example, in some embodiments, the reverberation plate may bent or folded onto itself in one direction so that a distance from a first end of the reverberation plate to a second end of the reverberation plate is less than a length of a top surface of the reverberation plate from the first end to the second end (i.e., a flat sheet of material is bent/folded in one direction creating a "U" shape when looking top down at the reverberation plate). In other example embodiments, the reverberation plate may bent so that a distance from a first end of the reverberation plate is connected to (or at least touching or close to touching) a second end of the reverberation plate (i.e., a flat sheet of material is bent creating a "O" shape when looking top down at the reverberation plate). In other example embodiments, the reverberation plate may bent so that a distance from a first end of the reverberation plate is closer to a second end of the reverberation plate by collapsing the plate on itself in one direction (i.e., a flat sheet of material is bent creating a "S" shape when looking top down at the reverberation plate). Furthermore, although the aforementioned example reverberation plate configurations are described with one and/or two primary bended portions, many additional configurations are possible by bending the reverberation plate in one, two, and three dimensional configuration. In some example embodiments, the reverberation plate may have several similar bends (i.e., a flat sheet of material is bent creating a shape resembling several continuous bends "~~~~~" when looking top down at the reverberation plate). In other examples, the reverberation plate may have a particular bends at one portion ("U" shaped bend at one portion) and a different bend at another portion ("S" shaped bend at another portion). In other examples, the reverberation plate may be bent into a three dimensional shape (e.g., a hollow sphere, etc.). Other examples are possible.

In these example embodiments, the space required to house/contain these reverberation plates (e.g., inside a reverberation device) is reduced in one or more directions. Additionally, in these examples, there may be some portions and surfaces of the reverberation plate that are flatter and/or more bended than others. Additional advantages of various configurations of the reverberation plate are the sonic and audio signal possibilities that do not exist in very large, continuous, flat sheets of metal. For example, compared to traveling from one end of large, continuous, flat sheet of metal, an amplified audio signal will behave differently when traveling through a material configured in one or more of the shapes described above. Additionally, the resultant amplified audio signal that is measured and/or received different points on the shaped reverberation plate may be different than the analogous points on a flat reverberation plate. Other factors may affect this signal transformation as well. Additional examples and/or configurations are possible.

For example, the reverberation plate may be configured with various physical dimensions (e.g., height, width, length, thickness, bend angles, etc.) depending on the configuration of the reverberation and/or the desired effect, among other possibilities. In other examples, the reverberation plate may contain variances throughout the material to produce desired effects, including one or more perforations, different material thickness at different points, different materials at different points, and other possibilities.

Additionally, the reverberation plate may interact with one or more external mechanisms that affect the performance of the reverberation plate and/or the resultant effect. For example, the reverberation plate may be suspended using one or more materials, in one or more configurations, depending on the configuration and/or the desired effect. For example, the reverberation plate may be suspended inside the cabinet of a reverberation device using springs attached to a top and bottom portion of the reverberation plate. In another example, the reverberation plate may be suspended inside the cabinet of a reverberation device using more rigid materials (e.g., metal wire) or softer materials (e.g., cloth string), and/or different materials at different connection points with the reverberation plate, cabinet, or both.

Additionally or alternatively, the reverberation plate may be in close proximity and/or touching one or more materials, in one or more configurations, used to dampen or other affect an attribute of the reverberation plate. For example, the reverberation plate may be in contact with a dampening mechanism and/or material (e.g., felt, rubber, etc.) to reduce the resonance of the reverberation plate and/or shorten the number of times a reverberated signal progresses through the reverberation plate. In other examples, the reverberation plate may be may be in contact with a baffle or other components to control other characteristics the reverberation plates or other affect other attributes of the reverberation plate (e.g., a foam and/or styrofoam baffle). Additional examples and/or configurations are possible.

Additionally, once the amplified input signal has been transmitted into the reverberation plate, it may be transmitted out of the reverberation plate as an output signal using one or more transducers configured to transmit the output signal to an output amplifier. In some examples, the one or more output transducers may be configured to transmit the output signal out of one or more surfaces of the reverberation plate, which may include a particular position on the surface and/or multiple surfaces of the reverberation plate. These configurations may be accomplished in a number of ways.

In other examples, the output transducer may be a piezoelectric transducer. In some examples, the piezoelectric transducer may be connected to a surface and/or fixed in one or more positions on one or more surfaces of the reverberation plate. For example, the output transducer may be mounted on a surface of the reverberation plate using one or more connection mechanisms and connected to one or more components of the reverberation device. In some examples, the output transducer may be mounted on a surface of the reverberation plate may be configured to transmit the amplified input signal at a particular position on a particular type of surface of the reverberation plate (e.g., on one or more bended surfaces of the reverberation plate), depending on the configuration of the reverberation and/or the desired effect, among other possibilities.

In a further aspect, the reverberation device may use one or more amplifiers (e.g., power amplifier, preamplifiers, etc.) or other technologies (e.g., line matching transformers, potentiometers, etc.) to adjust the output signal to a suitable to receive the output the output signal as an amplified output signal. In other example embodiments, one or more of these features may be centralized on a specific portion of the reverberation device (e.g., a control panel) to ensure convenient operation for the user. In a further aspect, the output amplifier and the input amplifier may be different amplifiers, configured in different ways, and/or located at different parts of the reverberation device, among other possibilities. Alternatively, the output amplifier and the input amplifier may be the same amplifier. Additional examples and/or configurations are possible.

In a further aspect, one or more of the components of the reverberation device (or the entire reverberation device) may be contained and/or partially use one or more enclosures (e.g., cases, shields, etc.). In one example, the entire reverberation device contained in an isolated enclosure cabinet to reduce and/or eliminate interference and/or feedback from external sound sources with one or more components of the reverberation device other than those inputted via an input of the reverberation device (e.g., sound coming from a nearby guitar amplifier speaker that interferes with one or more of the piezoelectric transducers of the reverberation device, which may create a feedback loop). Additional examples and/or configurations are possible.

These systems, methods, and devices may provide technical advantages and improve the portability, sonic capabilities, and consistency of reverberation devices. Other features of the systems, methods, and devices are described in further detail in the example embodiments provided below.

II. Example Architecture

A. Example Reverberation Device

Figure 1:
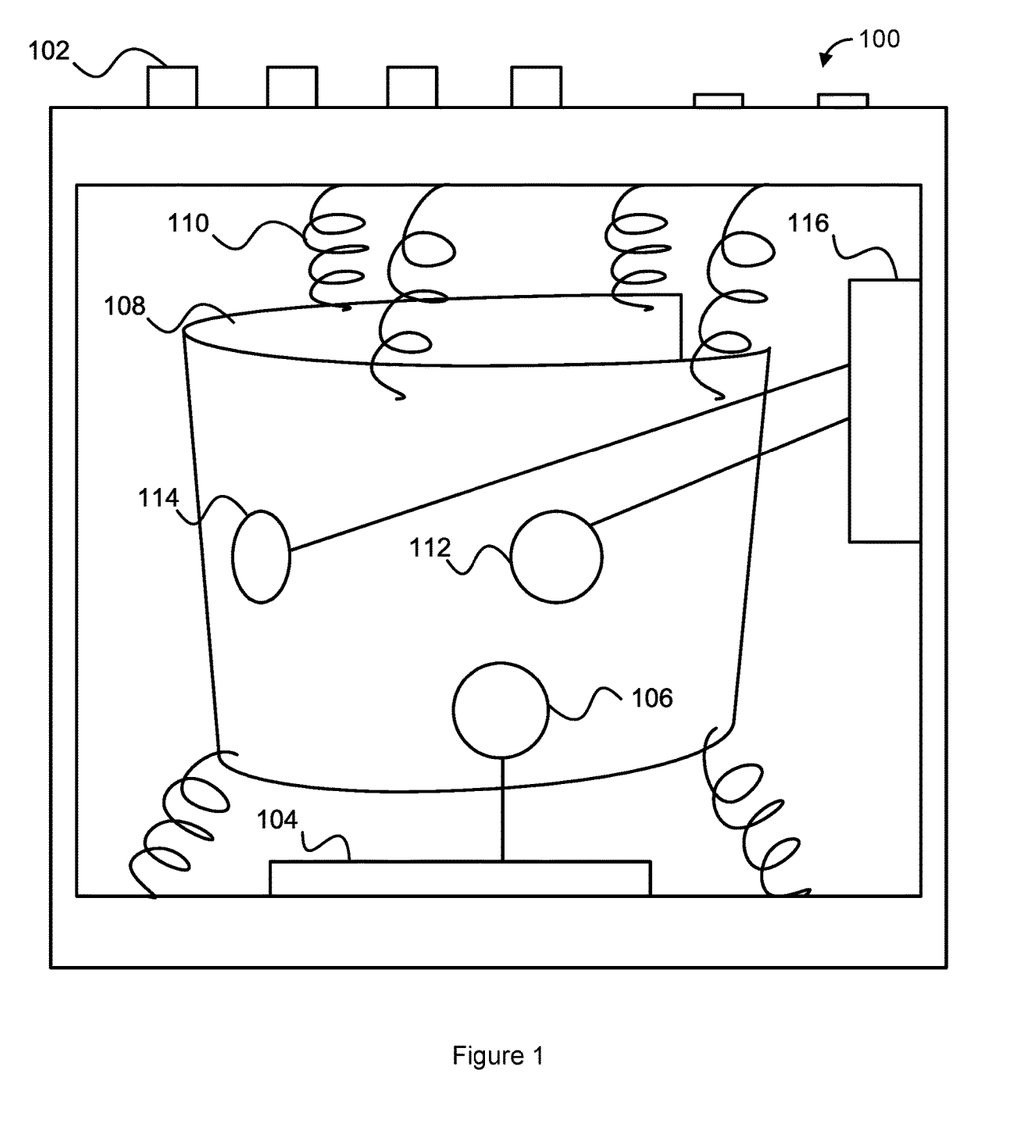
FIG. 1 is an example reverberation device.

FIG. 1 is an example reverberation device 100. The reverberation device 100 can perform various acts and/or functions related to creating an analog reverberation plate effect and may be implemented in a reverberation system.

It should also be readily understood that reverberation device 100 and any of the components thereof, can be physical systems made up of physical devices and components, analog and digital, or some combination of the two.

In any event, the reverberation device 100 can include various components, such as control panel 102, input amplifier 104, input transducer 106, reverberation plate 108 suspended inside reverberation device 100 by suspension mechanisms 110, output transducers 112 and 114, and output amplifier 116.

The reverberation device 100 can also include connection mechanisms, which connect the various components of the reverberation device (e.g., a connection mechanism between input amplifier 104 and input transducer 106, illustrated here as a straight line between the two components).

In practice, the reverberation device can allow the user to provide the reverberation device with an input signal from a musical instrument via an instrument input on control panel 102. The instrument input signal may be received by input amplifier 104 and an amplified input signal may be sent to input transducer 106, which may be a piezoelectric transducer or loudspeaker, among other possibilities. In a further aspect, various control parameters of the input amplifier 104 may be controlled by one or more controls on control panel 102 (e.g., tone, volume, mix, etc.).

Once the input transducer 106 receives the amplified input signal, it may transmit the amplified input signal to a surface of reverberation plate 108. Reverberation plate 108 is shown here suspended inside reverberation device 100 by suspension mechanisms 110. In this example embodiment, reverberation plate 108 is bent in one direction so that the distance between the first end of the reverberation plate and the second end of the reverberation plate is less than a length of the top surface of the reverberation plate from the first end to the second end, in essence creating a "U" shape when looking top down at the reverberation plate. In this example embodiment, input transducer 106 is connected to a substantially flat surface of reverberation plate 108.

Once the input transducer 106 has transmitted the amplified input signal into a surface of reverberation plate 108, the transmitted amplified input signal will travel throughout the body of reverberation plate 108 and may be received as an output signal at one or more positions on one or more surfaces of reverberation plate 108. For example, in this example embodiment, output transducer 112 (which may be a piezoelectric transducer, among other possibilities) is connected to a substantially flat surface of reverberation plate 108 and fairly proximate to input transducer 106, so the output signal received by output transducer 112 may have similar characteristics to the amplified input signal transmitted by input transducer 106. In this regard, the reverberated output signal received at output transducer 112 may be more akin to a "normal" plate reverb effect. Conversely, in this example embodiment, output transducer 114 (which may be a piezoelectric transducer, among other possibilities) is connected to a substantially bended surface of reverberation plate 108 and fairly distant to input transducer 106, so the output signal received by output transducer 114 may have substantially different characteristics than the amplified input signal transmitted by input transducer 106. In this regard, the reverberated output signal received at output transducer 114 may be produce new and different "bend" plate reverb effects. Other configurations are possible.

In a further aspect, output transducers 112 and 114 may transmit the output signal output amplifier 116, which may send the reverberated output signals to one or more sources (e.g., an audio mixer, an amplified speaker, etc.), and various control parameters of the output amplifier 114 may be controlled by one or more controls on control panel 102 (e.g., tone, volume, mix, etc.).

B. Example Reverberation Device

Figure 2:
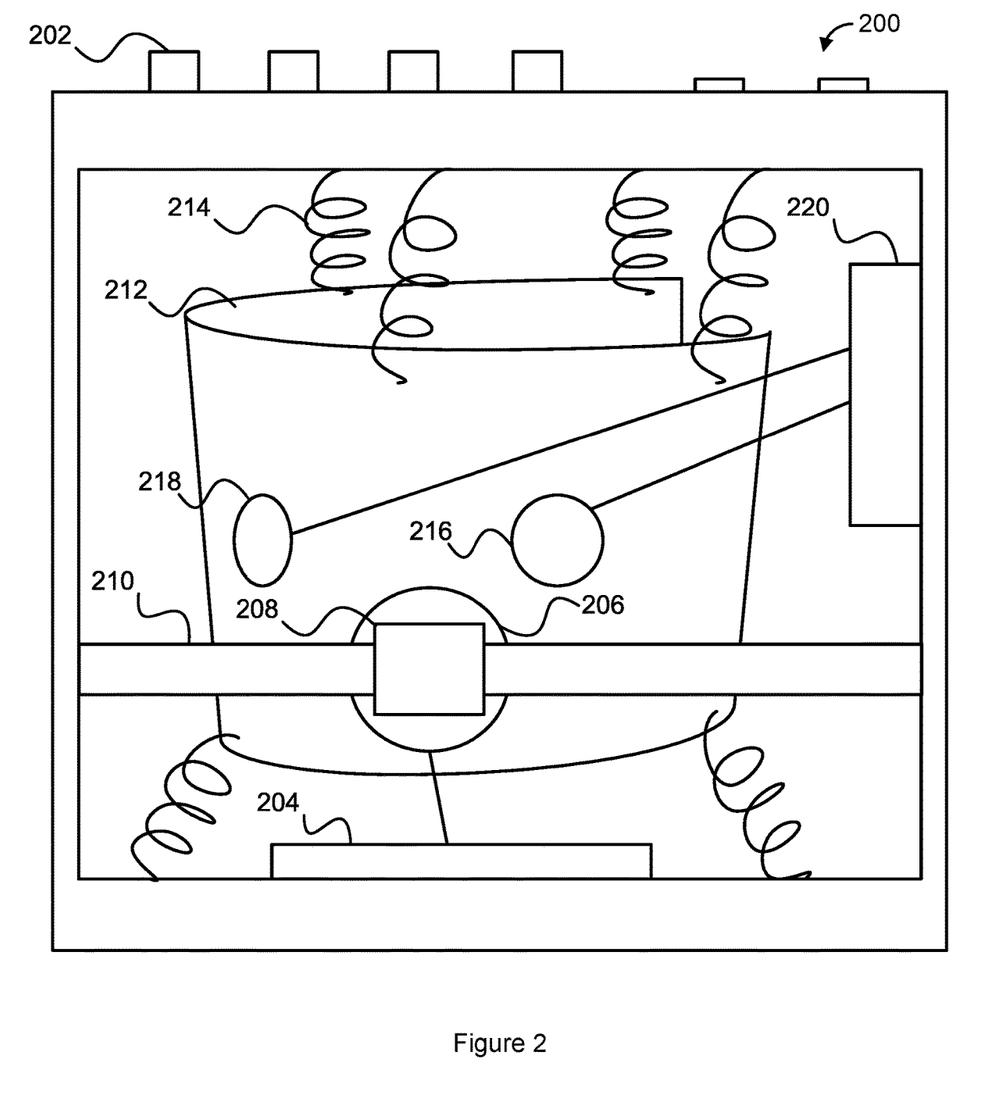
FIG. 2 is an example reverberation device.

FIG. 2 is an example reverberation device 200. The reverberation device 200 can perform various acts and/or functions related to creating an analog reverberation plate effect and may be implemented in a reverberation system.

It should also be readily understood that reverberation device 200 and any of the components thereof, can be physical systems made up of physical devices and components, analog and digital, or some combination of the two.

In any event, the reverberation device 200 can include various components, such as control panel 202, input amplifier 204, input transducer 206, input transducer mount 208, input transducer track 210, reverberation plate 212 suspended inside reverberation device 200 by suspension mechanisms 214, output transducers 216 and 218, and output amplifier 220.

The reverberation device 200 can also include connection mechanisms, which connect the various components of the reverberation device (e.g., a connection mechanism between input amplifier 204 and input transducer 206, illustrated here as a straight line between the two components).

In practice, the reverberation device can allow the user to provide the reverberation device with an input signal from a musical instrument via an instrument input on control panel 202. The instrument input signal may be received by input amplifier 204 and an amplified input signal may be sent to input transducer 206. In a further aspect, various control parameters of the input amplifier 204 may be controlled by one or more controls on control panel 202 (e.g., tone, volume, mix, etc.).

As illustrated in this example embodiment, input transducer 206 (which may be a piezoelectric transducer or loudspeaker, among other possibilities) may be positioned at various positions inside reverberation device 200 using input transducer mount 208 and input transducer track 210. For example, input transducer 206 may be connected to input transducer track 210 using input transducer mount 208, which may allow the input transducer to be moved along one or more axes relative to reverberation plate 212. In FIG. 2, input transducer 206 can slide along transducer track in a horizontal direction, but there may be more than one mount and/or track that allows the transducer to slide in more than one direction (e.g., in both vertical and horizontal directions relative to the reverberation plate). In some examples, input transducer mount 208 may allow input transducer 206 to slide along input transducer track 210 and once a user selects a position along input transducer track 210, input transducer mount 208 may lock the input transducer 206 in a particular position along input transducer track 210. In other examples, input transducer mount 208, input transducer track 210, or both may be used to control other variables of the position of input transducer 206 relative to reverberation plate 212 (e.g., input transducer mount 208 may control a distance between input transducer 206 to reverberation plate 212). Other examples are possible.

In any event, input transducer 206 may also transmit the amplified input signal to a surface of reverberation plate 212. Reverberation plate 212 is shown here suspended inside reverberation device 200 by suspension mechanisms 214. In this example embodiment, reverberation plate 212 is bent in one direction so that the distance between the first end of the reverberation plate and the second end of the reverberation plate is less than a length of the top surface of the reverberation plate from the first end to the second end, in essence creating a "U" shape when looking top down at the reverberation plate. In this example embodiment, input transducer 206 is connected to a substantially flat surface of reverberation plate 212.

Once the input transducer 206 has transmitted the amplified input signal into a surface of reverberation plate 212, the transmitted amplified input signal will travel throughout the body of reverberation plate 212 and may be received as an output signal at one or more positions on one or more surfaces of reverberation plate 212. For example, in this example embodiment, output transducer 216 (which may be a piezoelectric transducer, among other possibilities) is connected to a substantially flat surface of reverberation plate 212, so the output signal received by output transducer 216 may have similar characteristics to the amplified input signal transmitted by input transducer 206. In this regard, the reverberated output signal received at output transducer 216 may be more akin to a "normal" plate reverb effect. Conversely, in this example embodiment, output transducer 218 (which may be a piezoelectric transducer, among other possibilities) is connected to a substantially bended surface of reverberation plate 212, so the output signal received by output transducer 218 may have substantially different characteristics than the amplified input signal transmitted by input transducer 216. In this regard, the reverberated output signal received at output transducer 218 may be produce new and different "bend" plate reverb effects. Other configurations are possible.

In a further aspect, output transducers 216 and 218 may transmit the output signal output amplifier 220, which may send the reverberated output signals to one or more sources (e.g., an audio mixer, an amplified speaker, etc.), and various control parameters of the output amplifier 220 may be controlled by one or more controls on control panel 202 (e.g., tone, volume, mix, etc.).

C. Example Reverberation Device

Figure 3:
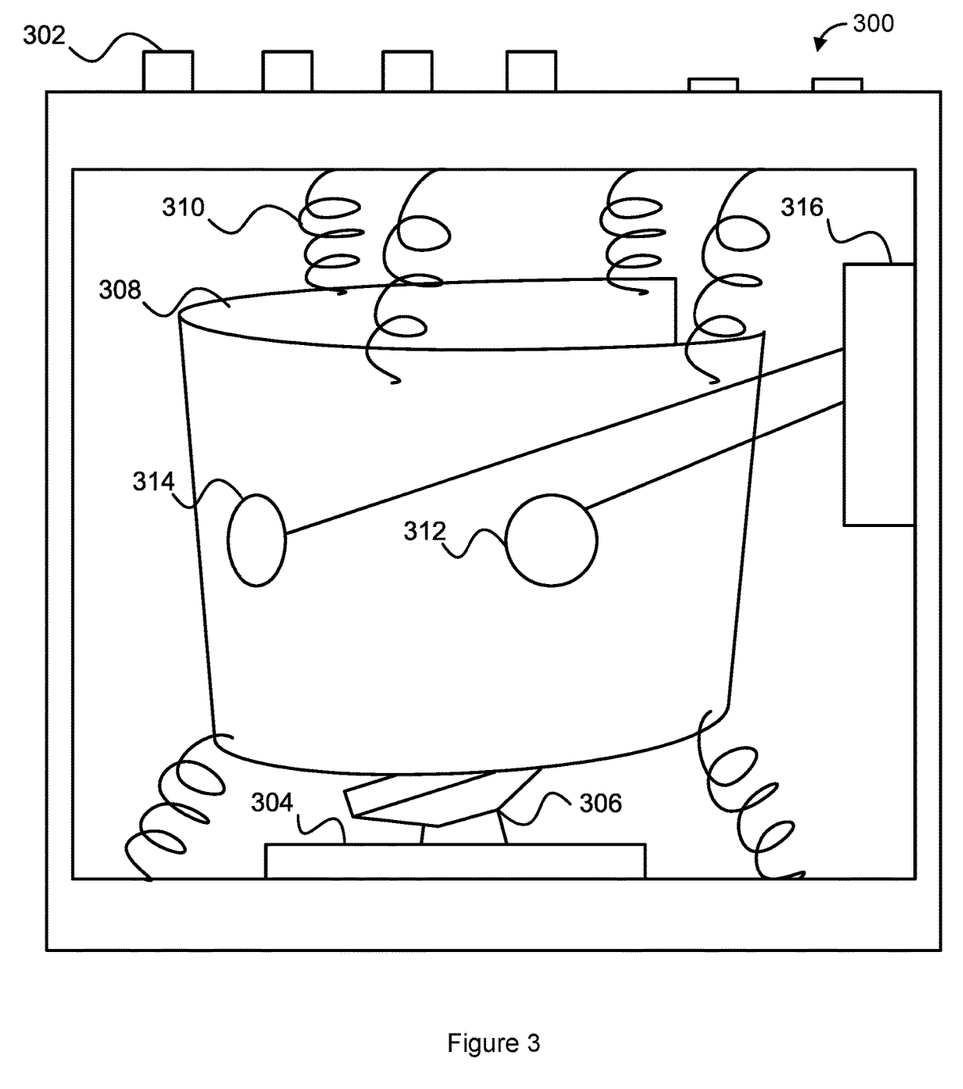
FIG. 3 is an example reverberation device.

FIG. 3 is an example reverberation device 300. The reverberation device 300 can perform various acts and/or functions related to creating an analog reverberation plate effect and may be implemented in a reverberation system.

It should also be readily understood that reverberation device 300 and any of the components thereof, can be physical systems made up of physical devices and components, analog and digital, or some combination of the two.

In any event, the reverberation device 300 can include various components, such as control panel 302, input amplifier 304, rotating loudspeaker 306, reverberation plate 308 suspended inside reverberation device 300 by suspension mechanisms 310, output transducers 312 and 314, and output amplifier 316.

The reverberation device 300 can also include connection mechanisms, which connect the various components of the reverberation device (e.g., a connection mechanism between output amplifier 316 and output transducers 312 and 314, illustrated here as straight lines between the components).

In practice, the reverberation device can allow the user to provide the reverberation device with an input signal from a musical instrument via an instrument input on control panel 302. The instrument input signal may be received by input amplifier 304 and an amplified input signal may be sent to rotating loudspeaker 306. Rotating loudspeaker 306 may be rotated using one or more mechanical devices, some or all of which may be integrated into input amplifier 304. In a further aspect, various control parameters of the input amplifier 304 and/or rotating loudspeaker 306 may be controlled by one or more controls on control panel 302 (e.g., tone, volume, mix, rotation rate/speed, etc.).

As illustrated in this example embodiment, rotating loudspeaker 306 may be positioned inside reverberation plate 308 and may transmit the amplified input signal to multiple surfaces of reverberation plate 308 at various rates and/or rotational speeds over time. In a further aspect, the distance between rotating loudspeaker 306 and the inside surfaces of reverberation plate 308 and/or the transmission angle of rotating loudspeaker 306 and the inside surfaces of reverberation plate 308 can be adjusted and/or varied in a number of ways. Reverberation plate 308 is shown here suspended inside reverberation device 300 by suspension mechanisms 310. In this example embodiment, reverberation plate 308 is bent in one direction so that the distance between the first end of the reverberation plate and the second end of the reverberation plate is less than a length of the top surface of the reverberation plate from the first end to the second end, in essence creating a "U" shape when looking top down at the reverberation plate.

Once rotating loudspeaker 306 has transmitted one or more amplified input signals into one or more surfaces of reverberation plate 308, the transmitted amplified input signals will travel throughout the body of reverberation plate 308 and may be received as output signals at one or more positions on one or more surfaces of reverberation plate 308. For example, in this example embodiment, output transducer 312 is connected to a substantially flat surface of reverberation plate 308, so the output signal received by output transducer 312 may have similar characteristics to the amplified input signal transmitted by rotating loudspeaker 306. In this regard, the reverberated output signal received at output transducer 312 may be more akin to a "normal" plate reverb effect. Conversely, in this example embodiment, output transducer 314 is connected to a substantially bended surface of reverberation plate 308, so the output signal received by output transducer 314 may have substantially different characteristics than the amplified input signal transmitted by rotating loudspeaker 306. In this regard, the reverberated output signal received at output transducer 314 may be produce new and different "bend" plate reverb effects. Other configurations are possible.

In a further aspect, output transducers 312 and 314 may transmit the output signal output amplifier 316, which may send the reverberated output signals to one or more sources (e.g., an audio mixer, an amplified speaker, etc.), and various control parameters of the output amplifier 316 may be controlled by one or more controls on control panel 302 (e.g., tone, volume, mix, etc.).

D. Example Control Panel for Example Reverberation Device

Figure 4:
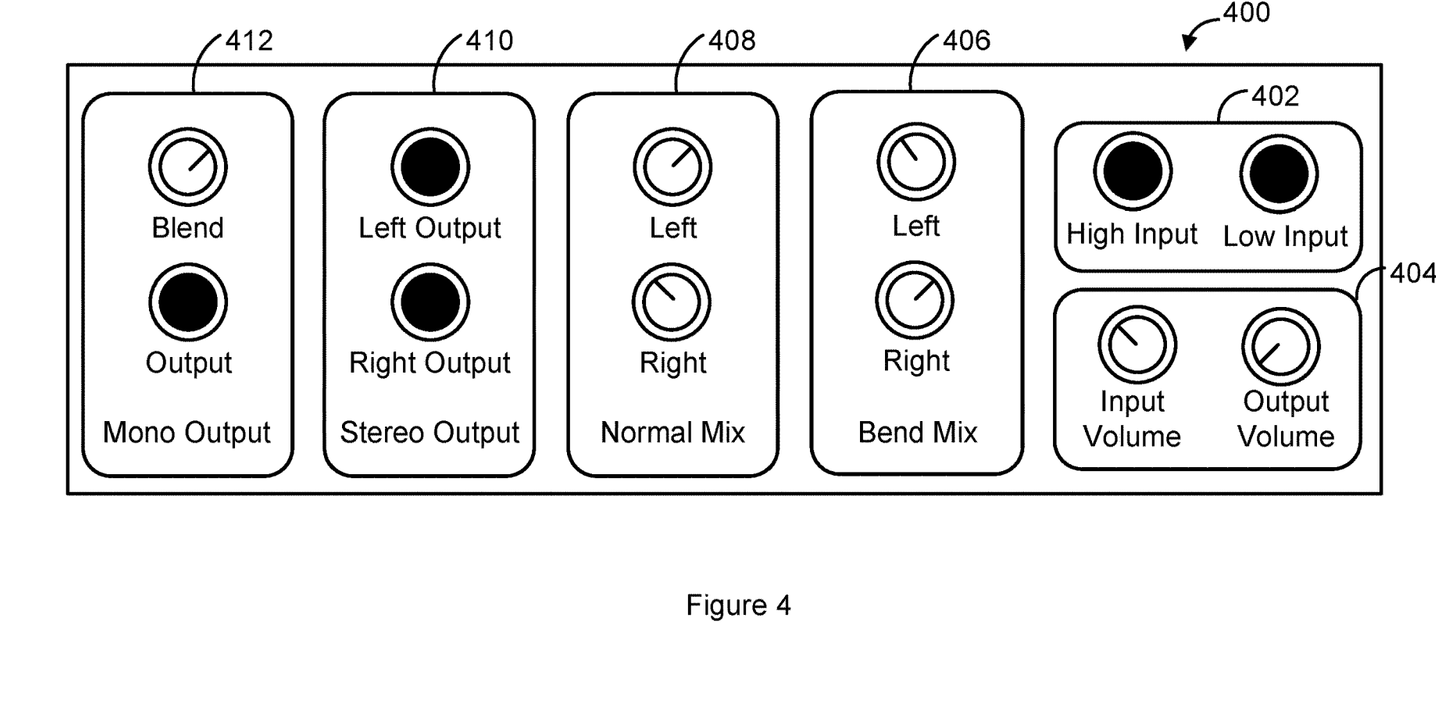
FIG. 4 is an example control panel for an example reverberation device.

FIG. 4 is an example control panel 400 for a reverberation device, such as those illustrated in FIGS. 1-3 above. The control panel 400 can perform various acts and/or functions related to creating an analog reverberation plate devices and effects, and may also be implemented in a reverberation system.

It should also be readily understood that control panel 400 and any of the components thereof, can be physical systems made up of physical devices and components, analog and digital, or some combination of the two.

In any event, the control panel 400 can include various components, such instrument inputs 402, volume controls 404, bend mix controls 406, normal mix controls 408, stereo outputs 410, and mono output 412.

In practice, the control panel 400 can allow the user to input a signal from a musical instrument into the reverberation device via instrument inputs 402 and control various aspects of the audio signal that is produced by the reverberation device.

For example, the volumes of the input amplifier and/or output amplifiers the reverberation devices discussed in connection with FIGS. 1-3 above may be controlled via volume controls 404, labeled here as "INPUT VOLUME" (which corresponds to the volume of the amplified input signal) and "OUTPUT VOLUME" (which corresponds to the volume of the amplified output signal). By allowing a user to vary these volumes, additional sonic capabilities and effects may be achieved. For example, if the user increases the input volume, the volume/intensity of the amplified input signal transmitted onto a surface of the reverberation plate increases and the reverberation plate may physically and acoustically react in different ways, which will result in a number of different output signals and/or effects. For example, by increasing the input volume, the amplified input signal creates an overdrive/distortion effect by overdriving a piezoelectric transducer connected to a surface of the reverberation plate. Other examples are possible.

In a further aspect, assuming that the amplified out signal is split into a stereo signal, shown here as a "LEFT" signal and a "RIGHT" signal, then the bend mix controls 406 and normal mix controls 408 also add additional sonic capabilities to the reverberation device. In this example, bend mix controls 406 correlate to the output transducers connected to substantially bended surfaces of a reverberation plate and normal mix controls 408 correlate to the output transducers connected to substantially flat surfaces of a reverberation plate, as illustrated in FIGS. 1-3 above. By using bend mix controls 406 and normal mix controls 408, a user is able to determine how much of the "bend" amplified output signal and the "normal" amplified output signal is presented in the "LEFT" amplified output signal and the "RIGHT" signal amplified output signal. Conversely, if the user prefers a single amplified output signal, the user may use mono output 412 and control how much of the "bend" amplified output signal and the "normal" amplified output signal is presented in the mono output (e.g., by turning the "BLEND" control all the way to the left, only the "bend" amplified output signal is presented, by turning the "BLEND" control all the way to the right, only the "normal" amplified output is presented, and the two amplified output signals are blended in positions in between).

E. Example Method

Figure 5:
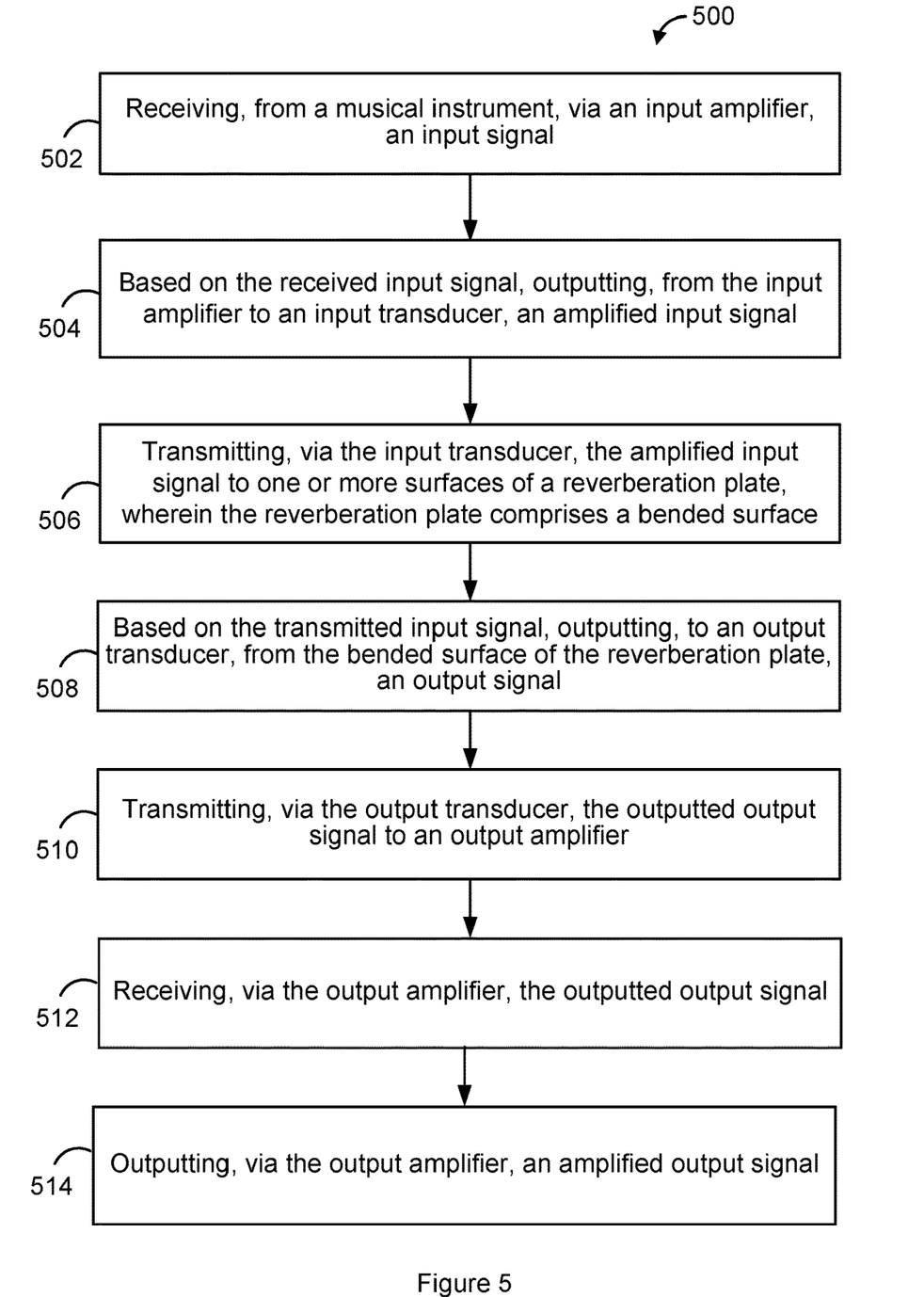
FIG. 5 is a flow chart of an example method.

FIG. 5 is a flow chart illustrating an example method 500.

At block 502, the method 500 can include, receiving, from a musical instrument, via an input amplifier, an input signal.

At block 504, the method 500 can include, based on the received input signal, outputting, from the input amplifier to an input transducer, an amplified input signal. In some examples, the input transducer may be a loudspeaker. In some examples, the loudspeaker may be a fixed position loudspeaker configured to transmit the amplified input signal at a particular position on a surface of a reverberation plate. In some examples, the loudspeaker may be a variable position loudspeaker configured to transmit the amplified input signal at multiple positions on a surface of a reverberation plate. In some examples, the loudspeaker may be a rotating loudspeaker configured to transmit the amplified input signal at multiple positions on a surface of a reverberation plate. In some examples, the input transducer may be a piezoelectric transducer connected to a surface of the reverberation plate. In some examples, the input transducer may transmit an amplified input signal at a flat surface of the reverberation plate. At block 506, the method 500 can include, transmitting, via the input transducer, the amplified input signal to one or more surfaces of a reverberation plate, wherein the reverberation plate comprises a bended surface. In some examples, the reverberation plate may comprise a metallic material. In some examples, the metallic material may comprise aluminum. In some examples, the metallic material may comprise steel. In some examples, the reverberation plate may comprise a wooden material. In some examples, the wooden material may comprise one or more of: (i) spruce; (ii) mahogany; (iii) maple; (iv) rosewood; (v) walnut; and (vi) pine. In some examples, a distance from a first end of the reverberation plate to a second end of the reverberation plate is less than a length of a top surface of the reverberation plate from the first end to the second end. In some examples, a first end of the reverberation plate and a second end of the reverberation plate are connected. In some examples, a first end of the reverberation plate and a second end of the reverberation plate are not connected. In some examples, the reverberation plate comprises a flat surface.

At block 508, the method 500 can also include, based on the transmitted input signal, outputting, to an output transducer, from the bended surface of the reverberation plate, an output signal. In some examples, the input transducer may be a piezoelectric transducer connected to the bended surface of the reverberation plate.

At block 510, the method 500 can include, transmitting, via the output transducer, the outputted output signal to an output amplifier.

At block 512, the method 500 can include, receiving, via the output amplifier, the outputted output signal.

At block 514, the method 500 can also include, outputting, via the output amplifier, an amplified output signal. In some examples, the input amplifier and the output amplifier are the same amplifier. In some examples, the input amplifier and the output amplifier are different amplifiers.

III. Example Variations

Although some of the acts and/or functions described in this disclosure have been described as being performed by a particular entity, the acts and/or functions can be performed by any entity, such as those entities described in this disclosure. Further, although the acts and/or functions have been recited in a particular order, the acts and/or functions need not be performed in the order recited. However, in some instances, it can be desired to perform the acts and/or functions in the order recited. Further, each of the acts and/or functions can be performed responsive to one or more of the other acts and/or functions. Also, not all of the acts and/or functions need to be performed to achieve one or more of the benefits provided by this disclosure, and therefore not all of the acts and/or functions are required.

Although certain variations have been discussed in connection with one or more examples of this disclosure, these variations can also be applied to all of the other examples of this disclosure as well.

Although select examples of this disclosure have been described, alterations and permutations of these examples will be apparent to those of ordinary skill in the art. Other changes, substitutions, and/or alterations are also possible without departing from the invention in its broader aspects as set forth in the following claims.

I claim:

1. A reverberation device configured for use with a musical instrument, comprising:
   an input transducer configured to receive an amplified input signal and transmit the amplified input signal;
   a reverberation plate comprising a bended surface, wherein the reverberation plate is connected to the input transducer, and wherein the reverberation plate is configured to output the amplified input signal as an output signal at the bended surface; and
   an output transducer connected to the reverberation plate at the bended surface and configured to transmit the output signal.

2. The reverberation device of claim 1, wherein the input transducer comprises a piezoelectric transducer connected to a surface of the reverberation plate.

3. The reverberation device of claim 1, wherein the reverberation plate comprises a metallic material.

4. The reverberation device of claim 3, wherein the metallic material comprises aluminum.

5. The reverberation device of claim 3, wherein the metallic material comprises steel.

6. The reverberation device of claim 1, wherein the reverberation plate comprises a wooden material.

7. The reverberation device of claim 6, wherein the wooden material comprises one or more of: (i) spruce; (ii) mahogany; (iii) maple; (iv) rosewood; (v) walnut; and (vi) pine.

8. The reverberation device of claim 1, wherein a distance from a first end of the reverberation plate to a second end of the reverberation plate is less than a length of a top surface of the reverberation plate from the first end to the second end.

9. The reverberation device of claim 1, wherein a first end of the reverberation plate and a second end of the reverberation plate are connected.

10. The reverberation device of claim 1, wherein the output transducer comprises a piezoelectric transducer connected to the bended surface of the reverberation plate.

11. The reverberation device of claim 1, wherein the reverberation plate comprises a metallic material and a flat surface, and wherein the input transducer is configured to transmit the amplified input signal at the flat surface.

12. The reverberation device of claim 11, wherein a distance from a first end of the reverberation plate to a second end of the reverberation plate is less than a length of a top surface of the reverberation plate from the first end to the second end.

13. The reverberation device of claim 1, wherein the reverberation device further comprises an input amplifier configured to receive an input signal from the musical instrument and output the amplified input signal based on the received input signal.

14. The reverberation device of claim 13, wherein the reverberation device further comprises an output amplifier configured to receive the transmitted output signal from the output transducer and output an amplified output signal.

15. The reverberation device of claim 14, wherein the input amplifier and the output amplifier are the same amplifier.

16. The reverberation device of claim 14, wherein the input amplifier and the output amplifier are different amplifiers.

17. The reverberation device of claim 1, wherein the input transducer comprises a loudspeaker.

18. The reverberation device of claim 17, wherein the loudspeaker is configured to transmit the amplified input signal at one or more particular positions on at least one surface of the reverberation plate.

19. A method comprising:
   receiving, via an input transducer, an amplified input signal;
   transmitting, via the input transducer, the amplified input signal to one or more surfaces of a reverberation plate, wherein the reverberation plate comprises a bended surface; and
   based on the transmitted amplified input signal, outputting, to an output transducer, from the bended surface of the reverberation plate, an output signal.

20. A reverberation system configured for use with a musical instrument, comprising:
   an input transducer configured to receive an amplified input signal and configured to transmit the amplified input signal;
   a reverberation plate comprising a bended surface, wherein the reverberation plate is connected to the input transducer, and wherein the reverberation plate is configured to output the amplified input signal as an output signal at the bended surface; and an output transducer connected to the reverberation plate at the bended surface and configured to transmit the output signal.

\* \* \* \* \*